(12) United States Patent
Konushi et al.

(10) Patent No.: US 6,798,808 B1
(45) Date of Patent: Sep. 28, 2004

(54) SEMICONDUCTOR LASER DEVICE AND METHOD OF MANUFACTURING SAME

(75) Inventors: Fumihiro Konushi, Nara (JP);
Nobuhiro Ohkubo, Ikoma (JP);
Shinichi Kawato, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/492,803

(22) Filed: Jan. 28, 2000

(30) Foreign Application Priority Data

Jan. 29, 1999 (JP) .......................... 11-021036
Dec. 24, 1999 (JP) .......................... 11-367043

(51) Int. Cl.⁷ .................................... H01S 5/00
(52) U.S. Cl. .............................. 372/45; 372/46
(58) Field of Search .................... 372/43–50

(56) References Cited

U.S. PATENT DOCUMENTS

| | | | |
|---|---|---|---|
| 5,034,957 A | * 7/1991 | Ohba et al. | 372/45 |
| 5,177,757 A | 1/1993 | Tsugami | 372/45 |
| 5,298,762 A | 3/1994 | Ou | 372/45 |
| 5,351,254 A | * 9/1994 | Tomita | 372/45 |
| 6,233,266 B1 | * 5/2001 | Kawasumi | 372/46 |

FOREIGN PATENT DOCUMENTS

| | | |
|---|---|---|
| JP | 63090186 A | 4/1988 |
| JP | 02033990 A | 2/1990 |
| JP | 04049691 A | 2/1992 |
| JP | 04074487 A | 3/1992 |
| JP | 08 046290 A | 2/1996 |
| JP | 09 260776 A | 10/1997 |
| JP | 10 209573 A | 8/1998 |
| JP | 10 321942 A | 12/1998 |
| JP | 11-54826 A | 2/1999 |

* cited by examiner

Primary Examiner—Quyen Leung
(74) Attorney, Agent, or Firm—Birch, Stewart, Kolasch & Birch, LLP (57) ABSTRACT

In a semiconductor laser device having a quantum well active layer, an undoped thin spacer layer is formed between an undoped optical guide layer and a p-type cladding layer. The thickness of the spacer layer is preferably 5 nm or more but less than 10 nm. The spacer layer absorbs impurities diffusing thereinto from the p-type cladding layer. Thus, the dopant is prevented from being diffused into the undoped optical guide layer.

19 Claims, 8 Drawing Sheets

SEMICONDUCTOR LASER DEVICE AND METHOD OF MANUFACTURING SAME

BACKGROUND OF THE INVENTION

1. Field of the Invention

The present invention relates to a semiconductor laser device to be used for optical disks, optical communications, and the like, and a method of manufacturing such a device. Particularly, the present invention relates to a semiconductor laser provided with a quantum well active layer which device has good characteristics and high reliability.

2. Description of the Related Art

In recent years, to improve speed in writing information to optical disks typified by CD-R/RW and DVD-R/RW, development of a semiconductor laser having an output power of as high as 100 mW has been expected.

To realize a semiconductor laser having a high power and reliability, it is necessary to prevent deterioration of end faces thereof and operate it at low electric current. To do so, it is more advantageous to provide the semiconductor laser device with a structure having a quantum well active layer than with a structure having a bulk active layer because the former is superior to the latter in the gain characteristics thereof.

Figure 7:
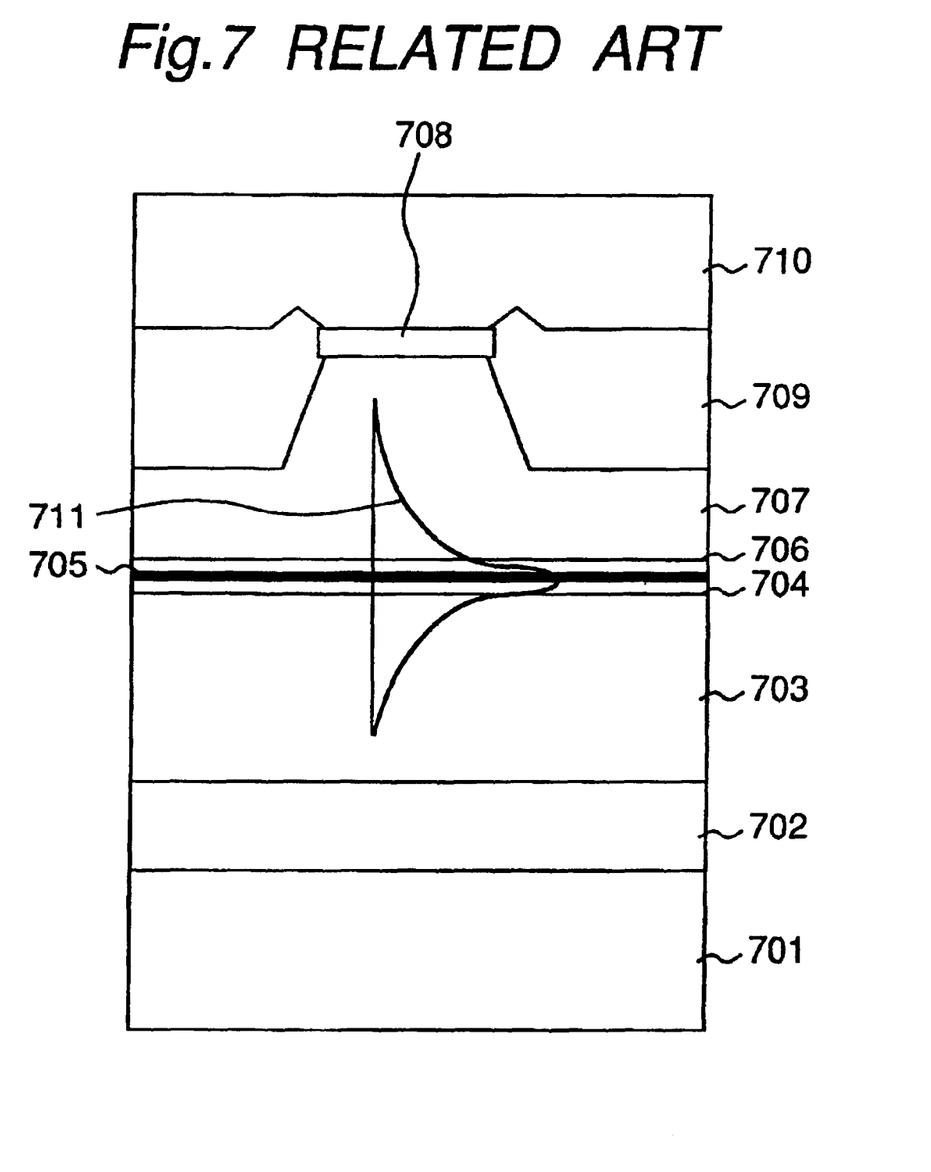
FIG. 7 is a sectional view showing the structure of a conventional semiconductor laser device.

FIG. 7 is a sectional view showing the structure of a conventional semiconductor laser device having a quantum well active layer. The device is formed as follows. On an n-type substrate 701 are formed a Si doped n-type buffer layer 702, a Si doped n-type cladding layer 703, an undoped optical guide layer 704, an undoped quantum well active layer 705, an undoped optical guide layer 706, a Zn doped p-type cladding layer 707, and a Zn doped p-type cap layer 708. Thereafter, the Zn doped p-type cap layer 708 and the Zn doped p-type cladding layer 707 are processed into the shape of a striped ridge, and a Si doped p-type block layer 709 is formed such that the striped ridge is embedded in the block layer 709. Further, a Zn doped p-type contact layer 710 is formed. In this manner, the semiconductor laser device is constructed. Reference numeral 711 denotes an optical distribution in an optical waveguide.

The optical guide layers 704 and 706 are formed at the lower and upper sides of the quantum well active layer 705 to entrap light in the quantum well active layer 705 and prevent diffusion of impurities into the quantum well active layer 705 from the p-type cladding layer 707 and the n-type cladding layer 703.

In the case of the semiconductor laser device having the bulk active layer, the diffusion of impurities into the active layer causes formation of a crystal defect acting as the center of recombination of optical carriers in the active layer. Consequently, the characteristic of the semiconductor laser device deteriorates. Further, the impurities diffuse easily into the active layer during the operation of the semiconductor laser device. Consequently, the life thereof deteriorates. In particular, Zn that is used as a p-type doping material diffuses at a high speed in a film. As a result, frequently, the active layer has a p-type electrical conductivity and causes a remote junction. In order to solve such a problem, trials of preventing the diffusion of the Zn have been made by forming, between the active layer and the p-type cladding layer, an undoped layer, a layer having an opposite (n-type) electrical conductivity, or a layer having a different composition in which the diffusion speed is low.

On the other hand, in the semiconductor laser device having the active layer composed of quantum well, the undoped optical guide layers formed at both sides of the quantum well layer serve to prevent the impurities from diffusing into the quantum well layer besides its essential roll.

The present inventors have confirmed that in the semiconductor laser device having the active layer composed of the quantum well, the dopant, or impurities diffuse even into the optical guide layer, which is provided to prevent the diffusion of the dopant into the quantum well layer, and that this results in deterioration of the characteristic of the semiconductor laser device. In particular, it has been found that with the diffusion of the dopant at a carrier concentration of more than $5 \times 10^{17}$ cm$^{-3}$ from the cladding layer into the optical guide layer, threshold current rises and the reliability of the device deteriorates. The phenomenon occurs for the following reason: In the case where the active layer is composed of the quantum well as shown in FIG. 7, the optical distribution 711 in the optical waveguide is large in the optical guide layers. Therefore, the defect formed by the dopant that has diffused in the optical guide layer acts as the center of recombination of optical carriers that have been distributed in the optical guide layer. The present inventors have also found that the amount of the diffusion of the dopant into the optical guide layer from the cladding layer and the diffusion length thereof depend on the concentration of the dopant of the cladding layer and a manufacturing condition.

SUMMARY OF THE INVENTION

It is therefore an object of the present invention to provide a semiconductor laser device with an quantum well active layer which is allowed to offer a high power and a preferable reliability, by preventing impurities from diffusing into an undoped optical guide layer. It is also an object of the present invention to provide a method of manufacturing such a semiconductor laser device.

To solve the above problem, according to an aspect of the present invention, in a semiconductor laser device having a quantum well active layer disposed between a pair of cladding layers, and an optical guide layer disposed between at least one of the cladding layers and the quantum well active layer, an undoped thin spacer layer is provided between the optical guide layer and the at least one of the cladding layers so that the spacer layer absorbs impurities diffusing thereinto from the cladding layer to thereby prevent them from diffusing into the optical guide layer. Therefore, a semiconductor laser device having high reliability can be obtained.

If the thickness of the spacer layer is smaller than 5 nm, the diffusion of impurities, or dopant into the optical guide layer will not be able to be sufficiently prevented. Consequently, the characteristic and reliability of the semiconductor laser device will deteriorate. On the other hand, if the thickness of the spacer layer is 10 nm or larger, an carrier concentration will become low. As a result, an electronic barrier will also be lowered. Consequently, the temperature characteristic of the semiconductor laser device will deteriorate. Accordingly, in order to securely obtain a semiconductor laser device having preferable characteristics and high reliability, the spacer layer may preferably have a thickness of 5 nm or more but less than 10 cm.

If the carrier concentration of a p-type cladding layer is higher than $5 \times 10^{18}$ cm$^{-3}$, a large quantity of impurities will diffuse into the optical guide layer. Consequently, the characteristic of the semiconductor laser device deteriorates. On the other hand, if the carrier concentration of the p-type cladding layer is lower than $8 \times 10^{17}$ cm$^{-3}$ disadvantageously, the temperature characteristic of the semiconductor laser device will be lowered and an operational voltage will increase. Therefore, it is preferable that the p-type cladding layer has a carrier concentration in a range of from $8 \times 10^{17}$ cm$^{-3}$ to $5 \times 10^{18}$ cm$^{-3}$.

In an embodiment, the spacer layer has a p-type electrical conductivity, and a carrier concentration at an interface between the spacer layer and the optical guide layer is between $5 \times 10^{18}$ cm$^{-3}$ and $5 \times 10^{17}$ cm$^{-3}$.

If the spacer layer has an n-type electrical conductivity, this tends to result in formation of a remote junction. If the carrier concentration at the interface between the spacer layer and the optical guide layer is less than $5 \times 10^{16}$ cm$^{-3}$, the temperature characteristic of the semiconductor laser device tends to be lowered and the operational voltage will increase. If the dopant diffuses into the optical guide layer at a carrier concentration more than $5 \times 10^{17}$ cm$^{-3}$, the device characteristics and reliability of the semiconductor laser device will deteriorate.

The spacer layer may have a composition identical to that of the p-type cladding layer or may be larger than the p-type cladding layer in a band gap.

In this case, light is well entrapped or confined in the active layer. Thus, good device characteristics and good optical emission characteristic are realized According to another aspect of the present invention, there is provided a method of manufacturing a semiconductor laser device, comprising the steps of sequentially forming, on an n-type substrate, an n-type doped buffer layer, an n-type doped cladding layer, a first undoped optical guide layer, an undoped quantum well active layer, a second undoped optical guide layer, p-type doped cladding layer, and a p-type doped cap layer by a vapor phase growth method, characterized by:

forming an undoped spacer layer between the second undoped optical guide layer and the p-type doped cladding layer.

Because the spacer layer is undoped, it is possible to securely obtain a p-type electrical conductivity and prevent diffusion of impurities into the optical guide layer. Also, the use of a vapor phase growth method enables the control of the thickness of the spacer layer in a nm order. Preferably, the undoped spacer layer may be formed in a thickness of 5 nm or more but below 10 nm.

In an embodiment, each of the layers is formed by a MOCVD method and under a condition in which a growth temperature is from 650° C. to 800° C. both inclusive, and a ratio of a feed rate of a group V source to that of a group III source is from 50 to 200 both inclusive. In this case, it is possible to control the amount of diffusion of the impurities into the optical guide layer from the cladding layer and the diffusion length thereof and secure a good crystallinity. Therefore, it is possible to obtain a semiconductor laser device having good characteristics and high reliability.

The effect and function of the present invention will be described below.

The diffusion of impurities into the active layer of a semiconductor laser device causes formation of a crystal defect acting as the center of recombination of optical carriers in the active layer. Consequently, the characteristic of the semiconductor laser device deteriorates. Further, the impurities diffuse easily into the active layer during the operation of the semiconductor laser device. Consequently, the life of the device decreases. In particular, Zn that is used as a p-type doping material diffuses at a high speed in a film. As a result, the active layer has a p-type electrical conductivity, which results in formation of a remote junction.

In the semiconductor laser device having the quantum well as the active layer, an undoped optical guide layer formed at both sides of the quantum well layer has a roll of preventing the impurities from diffusing into the quantum well layer, in addition to its primary roll. However, as a result of the present inventors' research, it has been found that when the impurities or dopant diffuses from the cladding layer into the optical guide layer at a carrier concentration of more than $5 \times 10^{17}$ cm$^{-3}$, threshold current rises and the reliability of the semiconductor laser device deteriorates. The phenomenon can be considered to occur for the following reason: In the case where the active layer has a quantum well structure and is very thin, light in an optical waveguide is distributed in a comparatively large quantity in the optical guide layer. Therefore, a defect formed by the dopant that has diffused in the optical guide layer acts as the center of recombination of optical carriers. Again, it has been found that the semiconductor laser device whose active layer has a quantum well structure has a deteriorated characteristic when a: dopant such as, for example, Zn diffuses even into the undoped optical guide layer as well as the active layer. According to the present invention, the problem is solved by forming the undoped thin spacer layer between the optical guide layer and the cladding layer so that the spacer layer absorbs impurities diffusing thereto from the cladding layer to thereby prevent them from diffusing further into the optical guide layer. Therefore, according to the present invention, a semiconductor laser device having good characteristics and high reliability was obtained.

The amount of the diffusion of the dopant into the optical guide layer from the cladding layer and the diffusion length thereof depend on a concentration of the dopant of the cladding layer and a manufacturing condition. Therefore, it is possible to produce a semiconductor laser device having a high power and high reliability by optimizing the architecture and the manufacturing or producing conditions regarding the doping concentration and the thickness of each layer.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

Figure 1:
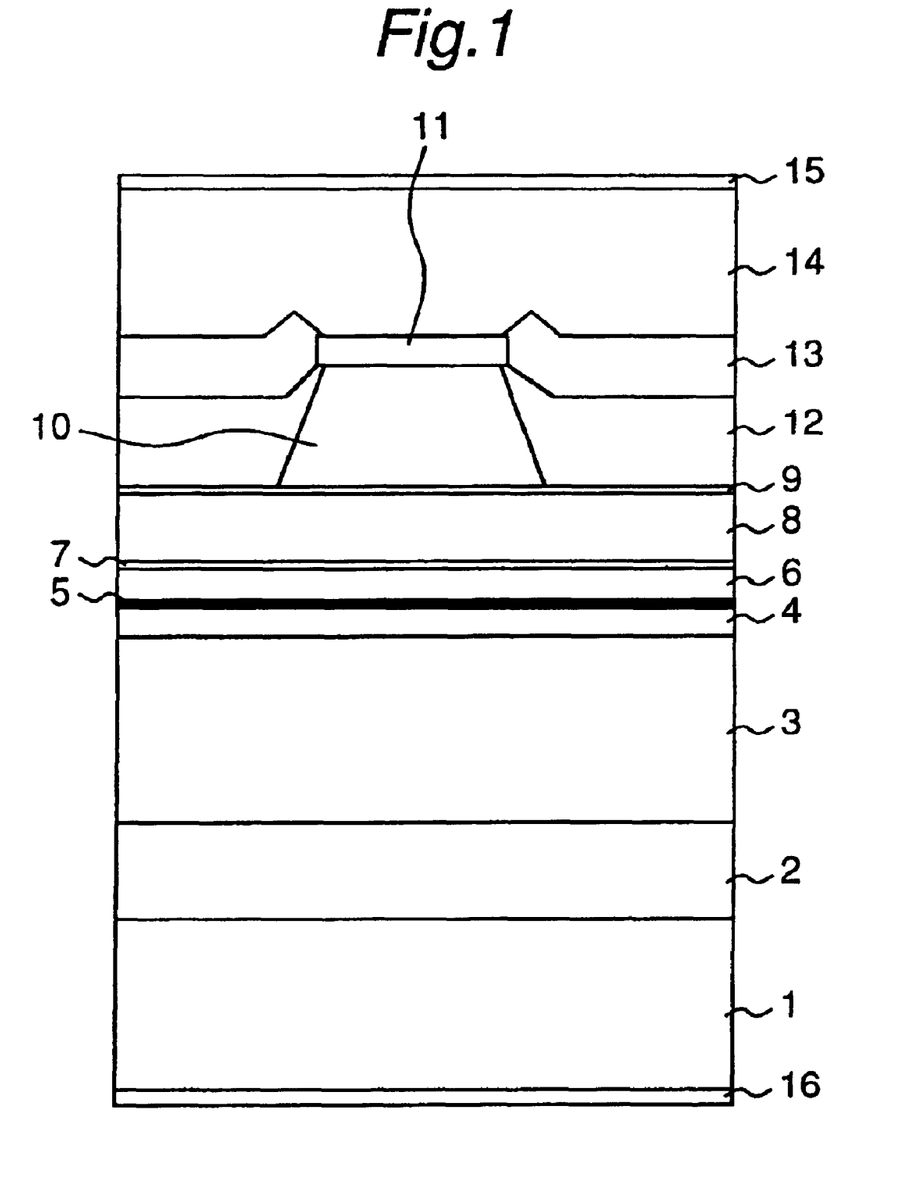
FIG. 1 is a sectional, view showing the structure of a semiconductor laser device of a first embodiment of the present invention.

FIG. 1 is a sectional view of a semiconductor laser device of a first embodiment. The semiconductor laser device is of a structure called real index guide type, which was formed as follows. First, the following layers were sequentially formed on an n-type GaAs substrate 1 (carrier concentration: $2\times10^{18}$ cm$^{-3}$) by a MOCVD method: an n-type GaAs buffer layer 2 (carrier concentration: $1.5\times10^{18}$ cm$^{-3}$, thickness: 500 nm), an n-type Al$_{0.35}$Ga$_{0.65}$As lower cladding layer 3 (carrier concentration: $8\times10^{17}$ cm$^{-3}$, thickness: 1000 nm), an undoped Al$_{0.35}$Ga$_{0.65}$As optical guide layer 4 (thickness: 30 nm), an undoped AlGaAs double quantum well active layer 5 (a well layer: 8 nm, a barrier layer: 5 nm), an undoped Al$_{0.35}$Ga$_{0.65}$As optical guide layer 6 (thickness: 30 nm), an undoped Al$_{0.5}$Ga$_{0.5}$As spacer layer 7 (thickness: 6 nm), a p-type Al$_{0.5}$Ga$_{0.5}$As upper first cladding layer 8 (carrier concentration: $2\times10^{18}$ cm$^{-3}$, thickness: 300 nm), an etching stopping layer 9, a p-type Al$_{0.5}$Ga$_{0.5}$As upper second cladding layer 10 (carrier concentration: $3\times10^{18}$ cm$^{-3}$, thickness: 1200 nm), and a p-type GaAs cap layer 11 (carrier concentration: $3\times10^{18}$ cm$^{-3}$, thickness: 800 nm).

Thereafter, the p-type GaAs cap layer 11 and the p-type Al$_{0.5}$Ga$_{0.5}$As upper second cladding layer 10 were processed into a stripe-shaped ridge having a width of 2–2.5 μm. Then, using the MOCVD method, n n-type Al$_{0.7}$Ga$_{0.3}$As electric current block layer 12 (carrier concentration: $2\times10^{18}$ cm$^{-3}$, thickness: 700 nm) and an n-type GaAs current block layer 13 (carrier concentration: $3\times10^{18}$ cm$^{-3}$, thickness: 500 nm) were formed such that the ridge consisting of the p-type GaAs layer 11 and the p-type Al$_{0.5}$Ga$_{0.5}$As upper second cladding layer 10 was embedded in these layers. Then, using the MOCVD method, a p-type GaAs contact layer 14 (carrier concentration: $5\times10^{18}$ cm$^{-3}$, thickness: 1000 nm) was formed.

Then, a p-electrode 15 was formed on the top, and an n-electrode 16 was formed on the underside. Finally, the wafer having the above layers was divided into bars such that the cavity length or resonator length was 600 μm. Light emission end surfaces of each bar at both sides thereof were asymmetrically coated with a reflection film (R=10%–95%). Then, each bar was divided into chips to form individual semiconductor devices. As the growth condition in the formation of the semiconductor laser device, TMG (trimethyl gallium) and TMA (trimethyl aluminum) were used as the group III source, and AsH$_3$ (arsine) was used as the group V source. Also, SiH$_4$ (silane) and DEZ (diethyl zinc) were used as the sources of n-type and p-type dopants, respectively. The growth temperature was 750° C., the growth pressure was 76 Torr, and the ratio of the feed rate of the group V source to that of the group III source was 120 (V/III=120).

For comparison, a semiconductor laser device (b) having a conventional structure not having a spacer layer between the optical guide layer and the p-type cladding layer was also prepared as a comparison sample. The result of the evaluation of characteristics of the semiconductor laser devices were as follows: The semiconductor laser device (a) of the first embodiment had a threshold current of 30 mA at the room temperature; showed an operational electric current of 130 mA at 85 mW; and operated reliably for more than 2,000 hours in the reliability test of CW at 85 mW. Because the undoped spacer layer 7 had the same composition as that of the p-type cladding layers 8 and 10, the optical emission characteristic thereof did not change irrespective of whether or not the semiconductor laser device had the space layer, and a desired optical emission characteristic (θ⊥=9°, θ∥=22°) was obtained.

On the other hand, in the comparative sample (b) having no spacer layer, the threshold current at the room temperature was 43 mA, which was more than that of the semiconductor laser device (a) of the first embodiment by more than 10 mA. It deteriorated in several hours in the reliability test conducted at 60° C. and 85 mW.

Figure 2A:
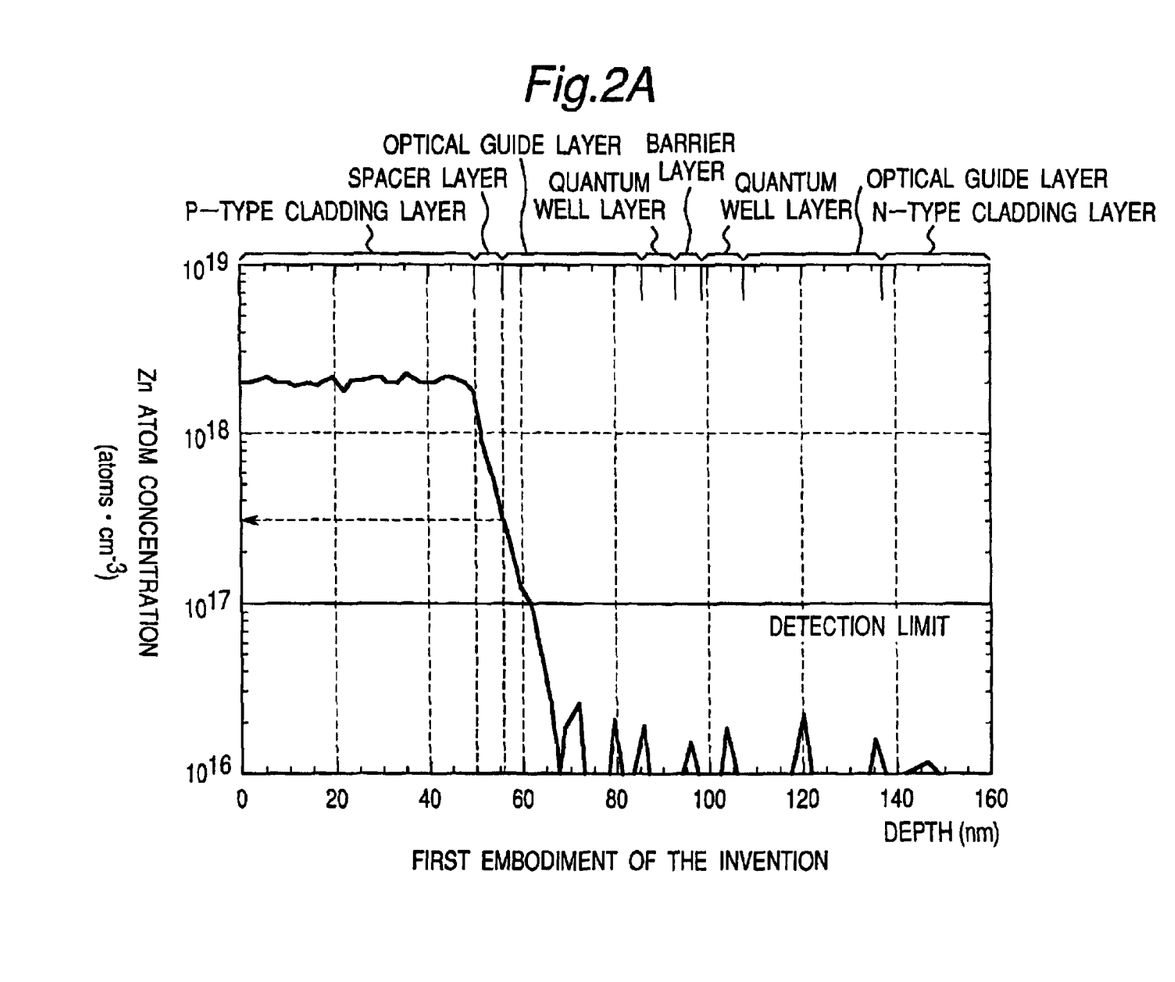
FIGS. 2A and 2B show the distribution of atoms of a dopant (Zn) in the vicinity of an active layer in a semiconductor laser device of the first embodiment and in a comparative sample having no spacer layer, respectively.
Figure 2B:
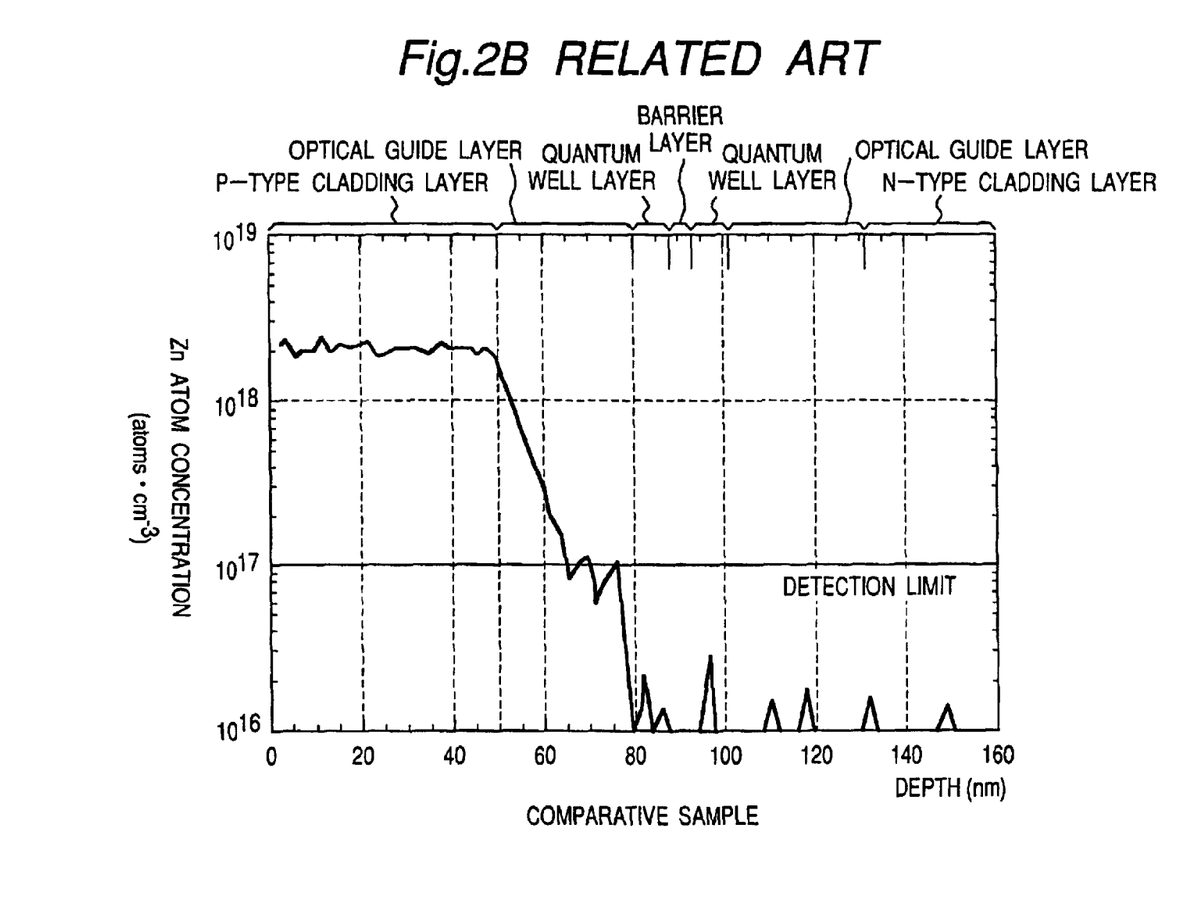

FIGS. 2A and 2B show the distribution of the atoms of a dopant (Zn) in the vicinity of the active layer in the semiconductor laser device (a) of the first embodiment and the conventional semiconductor laser device (b) having no spacer layer, respectively. The doping profile was measured by SIMS (secondary ion mass spectroscopy). As shown in FIGS. 2A and 2B, diffusion of the Zn from the p-type cladding layer toward the active layer was found in both semiconductor laser devices (a) and (b). In the device (b), diffusion of Zn from the p-type cladding layer into the optical guide layer was detected at a carrier concentration of $10^{17}$–$10^{18}$ cm$^{-3}$, although the diffusion of the Zn from the p-type cladding layer into the quantum well layer was not detected. On the other hand, in the semiconductor laser device (a) of the first embodiment, the spacer layer 7 blocks the diffusion of Zn from the p-type cladding layer, and thus the diffusion of the Zn atoms into the optical guide layer 6 was suppressed to a carrier concentration of less than $3\times10^{17}$ cm$^{-3}$.

Figure 3:
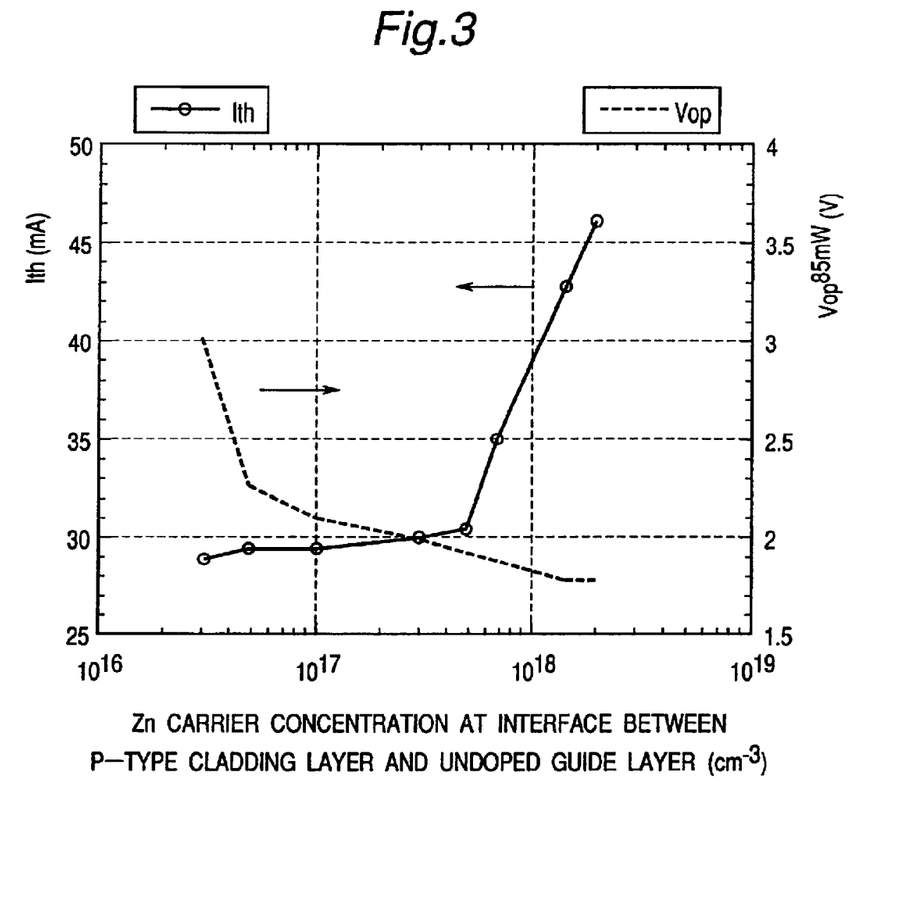
FIG. 3 shows changes in threshold current and operational voltage of a device at 85 mW/hour with respect to the carrier concentration at the interface between a p-type cladding layer and an optical guide layer.

FIG. 3 shows changes of the threshold current and the operational voltage at 85 mW/hour of the device with respect to the carrier concentration at the interface between the p-type cladding layer and the optical guide layer. As indicated in FIG. 3, the threshold current increases abruptly when the carrier concentration at the interface between the p-type cladding layer and the optical guide layer becomes more than $5\times10^{17}$ cm$^{-3}$, and the operational voltage increases abruptly when the carrier concentration becomes less than $5\times10^{16}$ cm$^{-3}$.

That is, the result indicates that the characteristic and reliability of the semiconductor laser device deteriorate owing to the diffusion of the dopant (Zn) into the optical guide layer. It is necessary to set the concentration of the Zn which diffuses into the optical guide layer to more than $5\times10^{16}$ cm$^{-3}$ and less than $5\times10^{17}$ cm$^{-3}$ at the interface between the p-type cladding layer and the optical guide layer. The diffusion of the Zn in the optical guide layer is preferably small, and is preferably in the range of $5\times10^{16}$ cm$^{-3}$–$5\times10^{17}$ cm$^{-3}$. A semiconductor laser device having superior characteristics and reliability was realized by forming the thin undoped spacer layer 7 between the optical guide layer 6 and the p-type cladding layer 8 to thereby prevent the diffusion of the dopant into the optical guide layer 6.

It is preferable that the thickness of the spacer layer 7 is large to prevent the diffusion of the dopant into the optical guide layer 6. But if the thickness of the spacer layer 7 is too large, the characteristic of the semiconductor laser device deteriorates. That is, if the thickness of the spacer layer 7 is too large, the carrier concentration at the cladding layer 8 on a hetero-interface decreases. As a result, a carrier barrier also decrease, and overflow of the carriers at a high temperature will increase. Consequently, the temperature characteristic of the semiconductor laser device deteriorates. Further, the resistance value and hence the operational voltage increase although locally. It will be understood from the above that for the thickness of the spacer 7, an optimum value is present.

Figure 4:
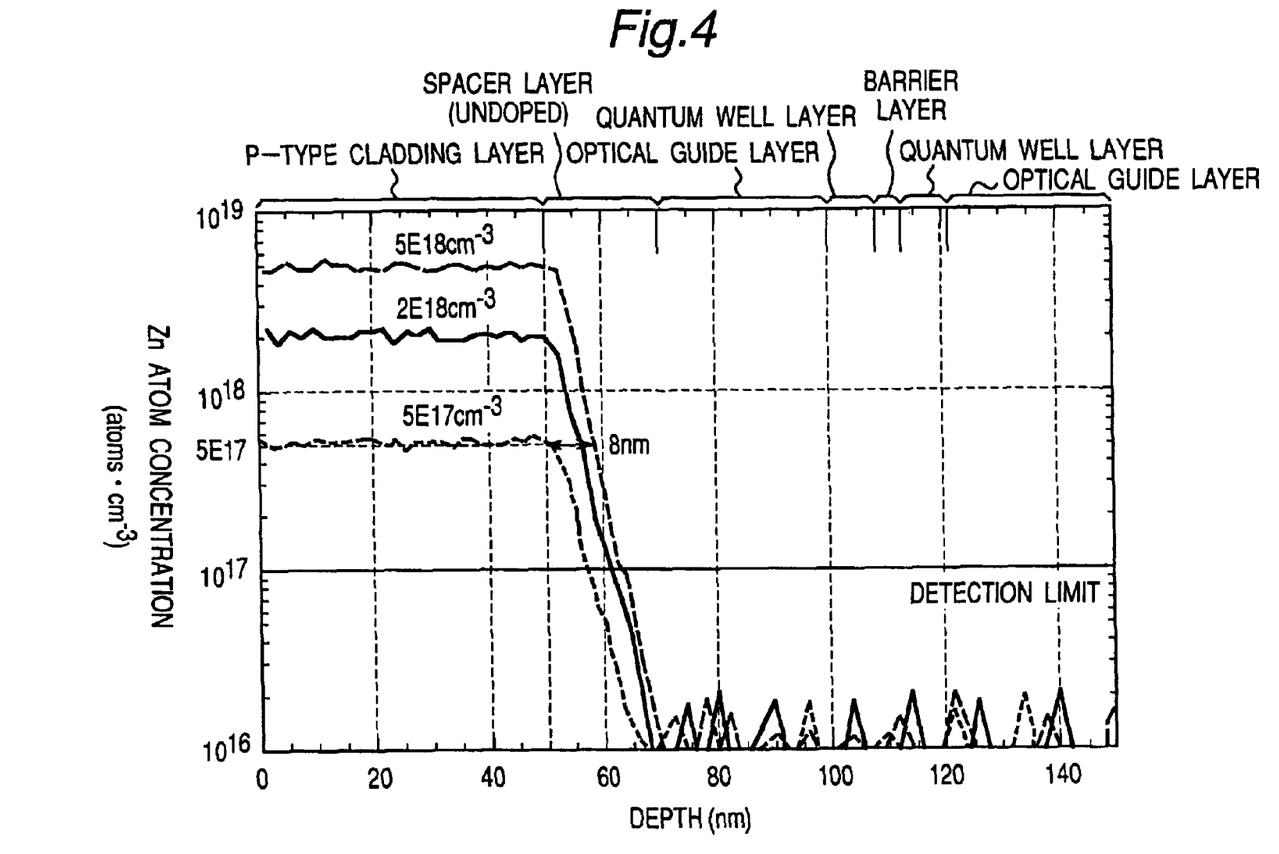
FIG. 4 shows a profile of diffusion of a dopant (Zn) into an undoped spacer layer for different carrier concentrations of the p-type cladding layer.

FIG. 4 shows profiles of diffusion of the dopant (Zn) in the undoped spacer layer when the carrier concentration of the p-type cladding layer is (a) $5\times10^{17}$ cm$^{-3}$, (b) $2\times10^{18}$ cm$^{-3}$, and $5\times10^{18}$ cm$^{-3}$. The spacer layer is formed to a thickness of 20 nm. The above experimental results indicate that it is necessary to limit the concentration of Zn that diffuses into the optical guide layer to less than $5\times10^{17}$ cm$^{-3}$. It is obvious from FIG. 4 that as the thickness of the spacer layer, about 8 rim is appropriate even in the case of (c) in which the carrier concentration is high, namely, $5\times10^{18}$ cm$^{-3}$. If the thickness of the spacer layer is less than 5 nm, the carrier concentration of the p-type cladding layer becomes more than $8\times10^{17}$ cm$^{-3}$, which cannot satisfy the above condition.

Accordingly, it is possible to obtain a semiconductor laser device having superior characteristics and reliability with high reproducibility by setting the carrier concentrations of the p-type cladding layers 8 and 10 to $8\times10^{17}$–$5\times10^{18}$ cm$^{-3}$ and the thickness of the spacer layer 7 to 5 nm or more but less than 10 nm. More preferably, the carrier concentrations of the p-type cladding layers 8 and 10 are set to $8\times10^{17}$ cm$^{-3}$–$3\times10^{18}$ cm$^{-3}$ and the thickness of the spacer layer 7 is set to 5 nm–8 nm both inclusive. The optimum carrier concentration of the p-type cladding layers 8 and 10 was $1.5\times10^{18}$cm$^{-3}$, and the optimum thickness of the spacer layer 7 was 6 nm. In the first embodiment, an example of manufacturing the semiconductor laser device by using the MOCVD method has been described. However, same effects and advantages can be obtained when the semiconductor laser device is made by a vapor phase growth method such as an MBE (molecular beam epitaxy) method, an MOMBE (metal organic MBE) method, or a GSMBE (gas source MBE) method, all of which are capable of controlling the layer thickness in an nm order.

Second Embodiment

Figure 5:
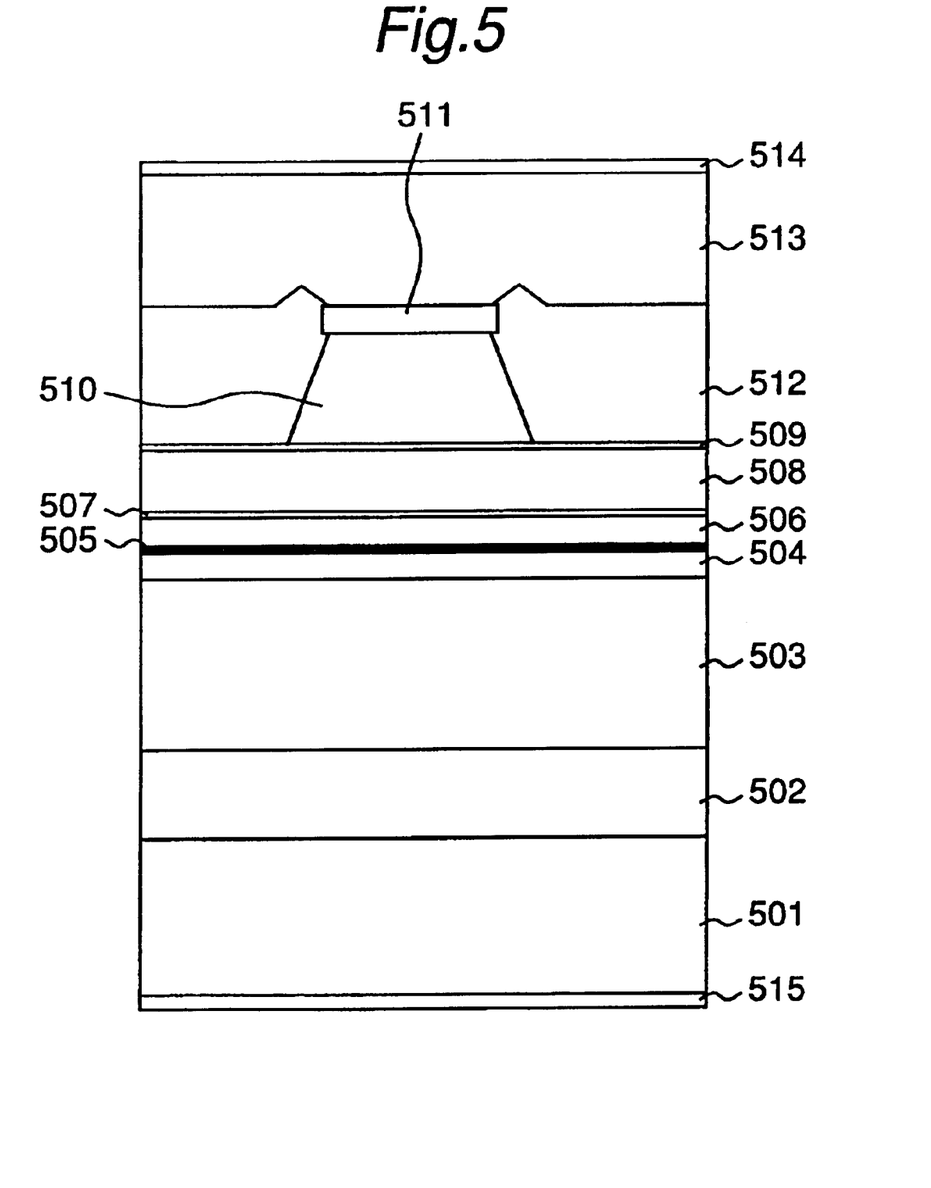
FIG. 5 is a sectional view showing the structure of a semiconductor laser device of a second embodiment.

FIG. 5 is a sectional view of an AlGaInP semiconductor laser of a second embodiment of the invention, which was formed as follows. First, using the MOCVD method, the following layers were formed on an n-type GaAs substrate 501 (carrier concentration: $2\times10^{16}$ cm$^{-3}$): an n-type GaAs buffer layer 502 (carrier concentration: $1.0\times10^{18}$ cm$^{-3}$, thickness: 500 nm), an n-type $In_{0.5}(Al_{0.7}Ga_{0.3})_{0.5}P$ lower cladding layer 503 (carrier concentration: $8\times10^{17}$ cm$^{-3}$, thickness: 1000 mL), an undoped $In_{0.5}(Al_{0.5}Ga_{0.5})_{0.5}P$ optical guide layer 504 (thickness: 35 nm), an undoped InAlGaP multi-quantum well layer 505 (constructed of four $In_{0.5}Ga_{0.5}P$ well layers each having a thickness of 7 nm alternating with $In_{0.5}(Al_{0.4}Ga_{0.6})_{0.5}P$ optical barrier layers each having a thickness of 8 nm), an undoped $In_{0.5}(Al_{0.5}Ga_{0.5})_{0.5}P$ optical guide layer 506 (thickness: 35 nm), an undoped $In_{0.5}(Al_{0.7Ga0.3})_{0.5}P$ spacer layer 507 (thickness: 8 nm), a p-type $In_{0.5}(Al_{0.7}Ga_{0.3})_{0.5}P$ upper first cladding layer 508 (carrier concentration: $5\times10^{17}$ cm$^{-3}$, thickness: 300 nm), an etching stopping layer 509, a p-type $In_{0.5}(Al_{0.7}Ga_{0.3})_{0.5}P$ upper second cladding layer 510 (carrier concentration: $2\times10^{18}$ cm$^{-3}$, thickness: 1,000 nm), and a p-type GaAs contact layer 511 (carrier concentration: $4\times10^{18}$ cm$^{-3}$, thickness: 500 nm).

Thereafter, the p-type GaAs contact layer 511 and the p-type $In_{0.5}(Al_{0.7}Ga_{0.3})_{0.5}P$ upper second cladding layer 510 were processed into a stripe-shaped ridge having a width of 4–5 μm. Then, an n-type GaAs current block layer 512 (carrier concentration: $2\times10^{18}$ cm$^{-3}$, thickness: 1,200 nm) was deposited by the MOCVD method, so that the ridge consisting of the p-type GaAs layer 11 and the p-type $In_{0.5}(Al_{0.7}Ga_{0.3})_{0.5}P$ upper second cladding layer 510 was embedded in the current block layer 512. Then, using the MOCVD method, a p-type GaAs contact layer 513 (carrier concentration: $4\times10^{18}$ cm$^{-3}$, thickness: 1,000 nm) was formed.

Then, a p-electrode 514 was formed on the top surface, and an n-electrode 515 was formed on the underside. Then, the wafer having the above layers was divided into bars such that the cavity length or resonator length was 800 μm. Light emission end surface of each bar at both sides thereof were asymmetrically coated with a reflection film (R=10%–95%). Finally, each bar was divided into chips to form individual semiconductor laser devices. As the film growth conditions in manufacturing of the device, the growth temperature was 650° C., and the growth pressure was 76 Torr, and the ratio of the feed rate of the group V source to that of the group III source was 200 (V/III=200). TMG (trimethyl gallium), TMA (trimethyl aluminum), and TMIn (trimethyl indium), and TMIn (trimethyl indium) were used as the group III sources, and $PH_3$ (phosphine) or TBP (tertiary butyl phosphine) was used as the group V source. Also, $SiH_4$ (silane) and DEZ (diethyl zinc) were used as the sources of n-type and p-type dopants, respectively.

The prototype device thus formed oscillated at a desired wavelength. Thus, it was confirmed the diffusion of the doping element (zn, Si) into the multi-quantum well layer and the optical guide layer was suppressed and that no disorder due to such a diffusion took place in the multi-quantum well layer. The characteristic of the prototype semiconductor laser device was good in that the threshold current at the room temperature was 45 mA and that it operated reliably for more than 2,000 hours in the reliability test at 60° C. and 30 mW.

Third Embodiment

Figure 6:
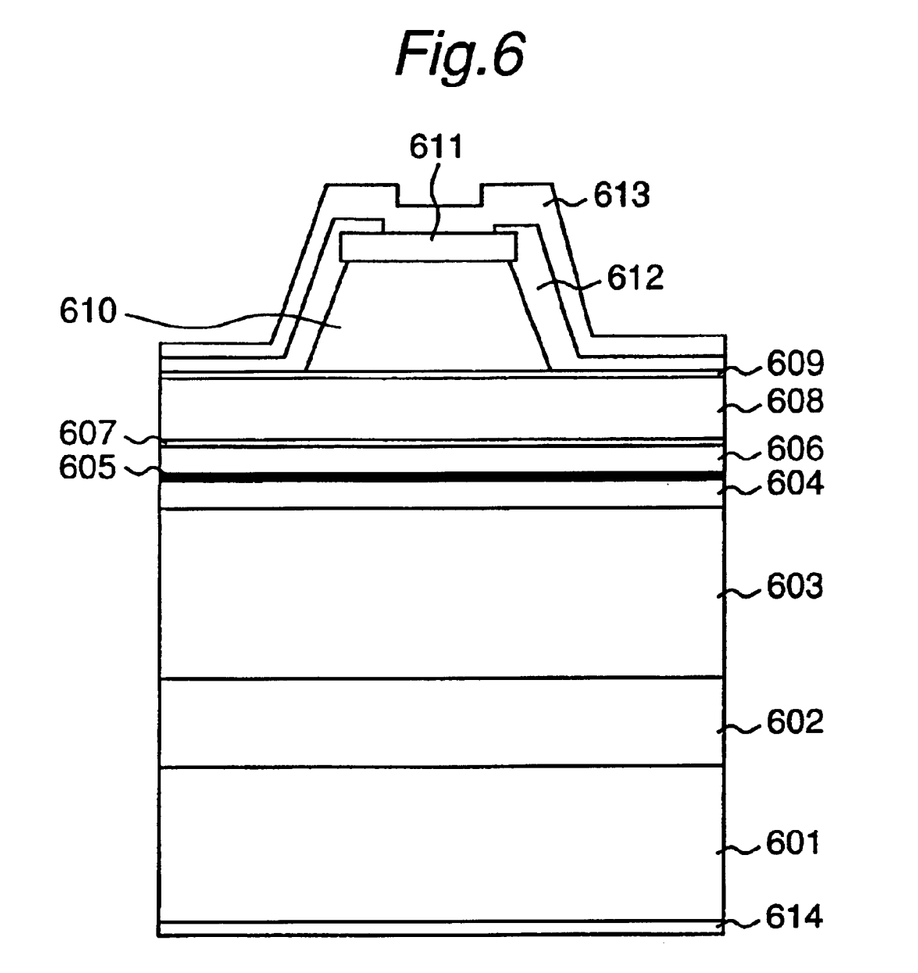
FIG. 6 is a sectional view showing the structure of a semiconductor laser device of a third embodiment.

FIG. 6 is a sectional view of a semiconductor laser device of a third embodiment, which has an InGaAs strained or pseudomorphic quantum well active layer. The laser device was made in the following manner. Using the MOCVD method, the following layers were formed on an n-type GaAs substrate 601 (carrier concentration: $2\times10^{18}$ cm$^{-3}$) an n-type GaAs buffer layer 602 (carrier concentration: $1.0\times10^{18}$ cm$^{-3}$, thickness: 500 nm), an n-type $Al_{0.4}Ga_{0.6}As$ lower cladding layer 603 (carrier concentration: $8\times10^{17}$ cm$^{-3}$, thickness: 1,000 nm, an undoped InGaAsP optical guide layer 604 (thickness: 35 nm), an undoped strained or pseudomorphic quantum well active layer 605 (constructed of two $In_{0.18}Ga_{0.82}As$ well layers each having a thickness of 7 nm alternating with an InGaAsP barrier layer having a thickness of 20 nm) an undoped InGaAsP optical guide layer 606 (thickness: 35 nm), an undoped $Al_{0.4}Ga_{0.6}As$ spacer layer 607 (thickness: 8 nm), a p-type $Al_{0.4}Ga_{0.6}As$ upper first cladding layer 608 (carrier concentration: $1\times10^{18}$ cm$^{-3}$, thickness: 300 nm), an etching stopping layer 609, a p-type $Al_{0.4}Ga_{0.6}As$ upper second cladding layer 610 (carrier concentration: $2\times10^{18}$ cm$^{-3}$, thickness: 1,000 nm), and a p-type GaAs contact layer (cap layer) 611 (carrier concentration: $4\times10^{18}$ cm$^{-3}$, thickness: 500 nm).

Thereafter, the p-type GaAs contact layer 611 and the p-type $Al_{0.4}Ga_{0.6}As$ upper second cladding layer 610 were processed into a stripe-shaped ridge having a width of 2–3 μm. Then, a $SiO_2$ film 612 was formed on the upper and .side surfaces of the ridge. Then, using photolithography, the $SiO_2$ film 612 formed on the upper surface of the ridge was removed to expose the p-type GaAs contact layer 611. Thereafter, a p-electrode 613 was formed on the top surface, and an n-electrode 614 was formed on the underside. Then, the wafer formed with the above layers was divided into a plurality of bars such that the cavity length or resonator length was 800 µm. Light emission end surfaces of each bar at both sides thereof were asymmetrically coated with a reflection film (R=8%–95%). Then, each bar was divided into chips to form individual semiconductor laser devices.

The growth conditions in manufacturing the semiconductor laser device were as follows: The growth temperature was 750° C. in the region up to the n-type $Al_{0.4}Ga_{0.6}As$ lower cladding layer 603; 680° C. in the region including the pseudomorphic quantum well layer 605 and the optical guide layers 604 and 606; 650° C. in the region including the undoped spacer layer 607, the p-type cladding layers 608 and 610, and the contact layer 611. The v/III ratio, namely the ratio of the feed rate of the group V source to that of the group III source was 200 in the region including the peseudomorphic quantum well active layer 605 and the optical guide layers 604 and 606, and was 120 in the other regions. The growth pressure was 76 Torr. By forming the n-type cladding layer 603, the pseudomorphic quantum well layer 605, and the optical guide layers 604 and 606 at an optimum temperature for each layer and an optimum V/III ratio, each layer was allowed to be securely provided with a good crystallinity. Also, the diffusion of Zn into the optical guide layer 606 was suppressed by forming the p-type cladding layer 608 and the layers disposed upward therefrom at reduced temperatures.

As the group III sources, TMG (trimethyl gallium), TMA (trimethyl aluminum), and TMIn (trimethyl indium) were used. As the group V source, $AsH_3$ (arsine) and $PH_3$ (phosphine) were used. Also, $SiH_4$ (silane) and DEZ (diethyl zinc) were used as the sources of n-type and p-type dopants, respectively.

The prototype semiconductor laser device had a threshold current of 30 mA, and operated reliably for more than 5,000 hours in the reliability test conducted at 80° C. and 150 mW.

In each of the embodiments, the MOCVD method was used for the crystal growth. However, same effects can be obtained by phase growth methods such as the MBE method, the MOMBE method, the GSMBE method, an ALE (atomic layer epitaxy) method, and a VPE (vapor phase epitaxy) method all of which are capable of controlling the layer thickness in a nm order.

As apparent from the foregoing description, in the semiconductor laser device having the active layer composed of the quantum well(s), the undoped thin spacer layer is formed between the optical guide layer and the cladding layer so that the spacer layer absorbs the dopant or impurities diffusing thereinto from the cladding layer to thereby prevent the impurities from diffusing into the optical guide layer. Therefore, the semiconductor laser device having good characteristics and high reliability is obtained. Furthermore, by optimizing the design of the device structure and the manufacturing conditions in terms of the dopant concentration and the thickness of the layers such as the cladding layer and the spacer layer, it is possible to control the amount of diffusion of the impurities into the optical guide layer from the cladding layer and the diffusion length thereof as well. Therefore, it is possible to realize a semiconductor laser device having a high power and high reliability. In particular, a preferable result can be obtained by forming the spacer layer between the optical guide layer and the Zn-doped p-type cladding layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device having a quantum well active layer disposed between a pair of cladding layers, and an optical guide layer disposed between at least one of the cladding layers and the quantum well active layer,
   wherein a spacer layer is provided between said optical guide layer and said at least one of the cladding layers, said spacer layer having an interface between the spacer layer and said optical guide layer, and
   wherein said optical guide layer has a thickness of 30 nm or 35 nm.

2. A semiconductor laser device according to claim 1, wherein said spacer layer is formed between the optical guide layer and a p-type cladding layer, and has a thickness of 5 nm or more but below 10 nm.

3. A semiconductor laser device according to claim 2, wherein said p-type cladding layer has a carrier concentration in a range of from $8\times10^{17}$ $cm^{-3}$ to $5\times10^{18}$ $cm^{-3}$.

4. A semiconductor laser device according to claim 2, wherein said spacer layer has a p-type electrical conductivity, and a carrier concentration at said interface between said spacer layer and said optical guide layer is more than $5\times10^{16}$ $cm^{-3}$ and less than $5\times10^{17}$ $cm^{-3}$.

5. A semiconductor laser device according to claim 2, wherein said spacer layer has a composition identical to that of said p-type cladding layer or is larger than said p-type cladding layer in a band gap.

6. The semiconductor laser device of claim 1, further comprising a second optical guide layer is disposed between a lower one of said pair of cladding layers and said quantum well active layer.

7. The semiconductor laser device of claim 6, further comprising a buffer layer below said lower one of said pair of cladding layers.

8. The semiconductor laser device of claim 1, wherein said quantum well active layer comprises an undoped multi-quantum well layer having two to four well layers alternating with optical barrier layers.

9. The semiconductor laser device of claim 8, wherein each of said well layers has a thickness of 8 nm and each of said optical barrier layers have a thickness of 5 nm.

10. The semiconductor laser device of claim 8, wherein each of said well layers has a thickness of 7 nm and each of said optical barrier layers have a thickness of 8 nm.

11. The semiconductor laser device of claim 8, wherein each of said well layers has a thickness of 7 nm and each of said optical barrier layers have a thickness of 20 nm.

12. A semiconductor laser device having a quantum well active layer disposed between a pair of cladding layers, and an optical guide layer disposed between at least one of the cladding layers and the quantum well active layer,
   wherein a spacer layer is formed between said optical guide layer and a p-type cladding layer, and
   wherein said spacer layer has a p-type electrical conductivity, and a carrier concentration at an interface between said spacer layer and said optical guide layer is more than $5\times10^{16}$ $cm^{-3}$ and less than $5\times10^{17}$ $cm^{-3}$.

13. A semiconductor laser device having a quantum well active layer disposed between a pair of cladding layers and an optical guide layer disposed between at least one of the cladding layers and the quantum well active layer, wherein a spacer layer consisting of a single layer of a thickness of 5 nm or more but below 10 nm is disposed between the optical guide layer and a p-type cladding layer, the spacer layer being in contact with both the optical guide layer and the p-type cladding layer.

14. A semiconductor laser device according to claim 13, wherein said spacer layer has a p-type electrical conductivity, and a carrier concentration at an interface between said spacer layer and said optical guide layer is more than $5 \times 10^{16}$ cm$^{-3}$ but less than $5 \times 10^{17}$ cm$^{-3}$.

15. A semiconductor laser device according to claim 13, wherein said p-type cladding layer has a carrier concentration in a range of from $8 \times 10^{17}$ cm$^{-3}$ to $5 \times 10^{18}$ cm$^{-3}$.

16. A semiconductor laser device according to claim 13, wherein said spacer layer has a composition identical to that of said p-type cladding layer or is larger than said p-type cladding layer in band gap.

17. A semiconductor laser device having a quantum well active layer disposed between a pair of cladding layers and an optical guide layer disposed between at least one of the cladding layers and the quantum well active layer, wherein a spacer layer consisting of a single layer and having a p-type electrical conductivity is disposed between the optical guide layer and a p-type cladding layer, the spacer layer being in contact with both the optical guide layer and the p-type cladding layer, and a carrier concentration at an interface between the spacer layer and the optical guide layer is more than $5 \times 10^{16}$ cm$^{-3}$ but less than $5 \times 10^{17}$ cm$^{-3}$.

18. A semiconductor laser device according to claim 17, wherein said p-type cladding layer has a carrier concentration in a range of from $8 \times 10^{17}$ cm$^{-3}$ to $5 \times 10^{18}$ cm$^{-3}$.

19. A semiconductor laser device according to claims 17, wherein said spacer layer has a composition identical to that of said p-type cladding layer or is larger than said p-type cladding layer in band gap.

\* \* \* \* \*